(12) United States Patent
Lee et al.

(10) Patent No.: US 9,384,687 B2
(45) Date of Patent: Jul. 5, 2016

(54) DEVICE DISPLAY

(71) Applicant: LG DISPLAY CO., LTD., Seoul (KR)

(72) Inventors: Dongho Lee, Pyeongtaek-si (KR);
Duhwan Oh, Chungju-si (KR);
Geunyoung Kim, Gimhae-si (KR)

(73) Assignee: LG Display Co., Ltd., Seoul (KR)

( * ) Notice: Subject to any disclaimer, the term of this patent is extended or adjusted under 35 U.S.C. 154(b) by 76 days.

(21) Appl. No.: 14/109,652

(22) Filed: Dec. 17, 2013

(65) Prior Publication Data

US 2014/0176399 A1  Jun. 26, 2014

(30) Foreign Application Priority Data

Dec. 21, 2012 (KR) .................. 10-2012-0151146
Dec. 2, 2013 (KR) .................. 10-2013-0148539

(51) Int. Cl.
| | |
|---|---|
| *H01L 51/52* | (2006.01) |
| *H05B 33/02* | (2006.01) |
| *G09G 3/20* | (2006.01) |
| *H01L 27/32* | (2006.01) |
| *G09G 3/32* | (2016.01) |

(52) U.S. Cl.
CPC .............. *G09G 3/20* (2013.01); *H01L 27/3276* (2013.01); *G09G 3/3233* (2013.01); *G09G 2300/0426* (2013.01); *G09G 2300/0809* (2013.01)

(58) Field of Classification Search
CPC ............ G09G 3/20; G09G 2300/0426; G09G 3/3233; G09G 2300/0809; H01L 29/3276; H01L 27/3276

USPC ................... 313/498, 500, 506, 512
See application file for complete search history.

(56) References Cited

U.S. PATENT DOCUMENTS

| | | | |
|---|---|---|---|
| 7,309,955 B2* | 12/2007 | Kim ............................ | 313/500 |
| 7,579,774 B2* | 8/2009 | Yamazaki et al. ............ | 313/505 |
| 8,013,513 B2* | 9/2011 | Sagawa et al. ................ | 313/500 |
| 8,035,765 B2* | 10/2011 | Tsai et al. ........................ | 349/39 |
| 2005/0179374 A1* | 8/2005 | Kwak ............................ | 313/506 |
| 2006/0125407 A1* | 6/2006 | Jeong .......................... | 315/169.3 |
| 2007/0108899 A1 | 5/2007 | Jung et al. | |
| 2008/0018245 A1 | 1/2008 | Kim et al. | |
| 2009/0289931 A1 | 11/2009 | Matsueda et al. | |
| 2010/0072482 A1 | 3/2010 | Eom et al. | |
| 2010/0245733 A1* | 9/2010 | Ono .................... | G02F 1/13394 349/106 |
| 2011/0157110 A1* | 6/2011 | Chou .................. | H01L 27/3279 345/205 |
| 2011/0241563 A1 | 10/2011 | Kim et al. | |
| 2013/0026505 A1 | 1/2013 | Lee et al. | |

* cited by examiner

*Primary Examiner* — Donald Raleigh
*Assistant Examiner* — Kevin Quarterman
(74) *Attorney, Agent, or Firm* — Birch, Stewart, Kolasch & Birch, LLP

(57) ABSTRACT

The present invention relates to a display device and, more particularly, to a display device configured to minimize short circuit of power lines by minimizing overlap between the power lines. A display device according to an aspect of the present invention includes: a first substrate on which data lines, scan lines intersecting the data lines, first to p-th (p being a natural number greater than 1) power lines through which first to p-th source voltages are supplied, and pixels arranged in a matrix form are formed; and a second substrate on which first to p-th auxiliary electrodes are formed, wherein the first to p-th power lines are respectively connected to the first to p-th auxiliary electrodes.

19 Claims, 9 Drawing Sheets

DEVICE DISPLAY

CROSS-REFERENCE TO RELATED APPLICATIONS

This application claims the benefit under 35 U.S.C. §119 (a) of Korean Patent Application No. 10-2012-0151146, filed on Dec. 21, 2012, and Korean Patent Application No. 10-2013-0148539, filed on Dec. 2, 2013, in the Korean Intellectual Property Office. The entire disclosures of all these applications are incorporated by reference herein for all purposes.

BACKGROUND

1. Technical Field

The present invention relates to a display device and, more particularly, to a display device configured to minimize short circuit of power lines by minimizing overlap between the power lines.

2. Related Art

With the development of information society, demand for display devices for displaying images has increased and various flat panel displays such as a liquid crystal display (LCD), a plasma display panel (PDP), an organic light emitting diode (OLED), etc. are currently used.

Among flat panel displays, an OLED display device is thin, has a wide viewing angle and high response speed and can be driven at low voltage. OLED display device includes a display panel having a plurality of pixels arranged in a matrix form. The display panel receives scan signals from a scan drive circuit for driving the pixels and receives data voltages from a data drive circuit. In addition, the display panel is provided with a plurality of source voltages from a power source to drive the pixels.

Recently, the number of source voltages supplied to the pixels of the display panel has increased for improvement of image quality. Due to this, the number of overlaps of power lines for supplying source voltages to the pixels in the display panel is increased, and thus the possibility of short circuit of power lines is increased. Furthermore, when power lines are short-circuited, the display device as well as a portion including the short-circuited power lines may be burnt.

SUMMARY

A display device according to an aspect of the present invention includes: a first substrate on which data lines, scan lines intersecting the data lines, first to p-th (p being a natural number greater than 1) power lines through which first to p-th source voltages are supplied, and pixels arranged in a matrix form are formed; and a second substrate on which first to p-th auxiliary electrodes are formed, wherein the first to p-th power lines are respectively connected to the first to p-th auxiliary electrodes.

The features and advantages described in this summary and the following detailed description are not intended to be limiting. Many additional features and advantages will be apparent to one of ordinary skill in the art in view of the drawings, specification and claims.

DETAILED DESCRIPTION OF THE EMBODIMENTS

The invention will be described more fully hereinafter with reference to the accompanying drawings, in which example embodiments of the inventions are shown. This invention may, however, be embodied in many different forms and should not be construed as limited to the embodiments set forth herein. Like reference numerals designate like elements throughout the specification. In the following description, if it is decided that a detailed description of known function or configuration related to the invention may obscure the subject matter of the invention, the detailed description is omitted.

Figure 1:
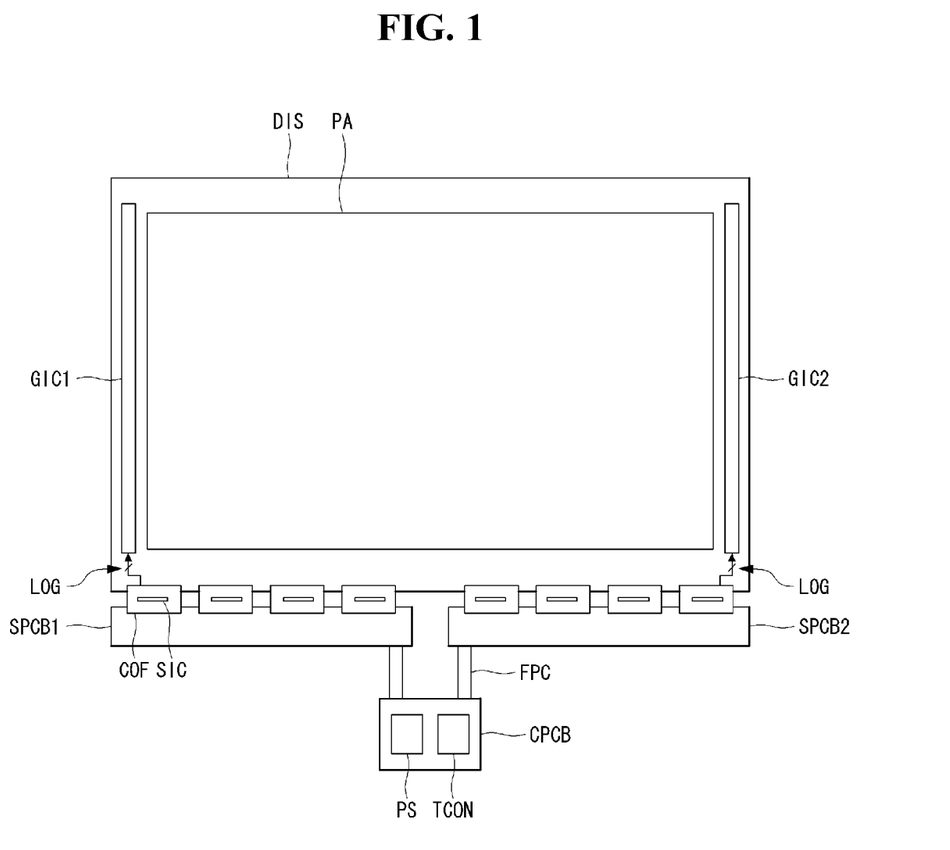
FIG. 1 illustrates a display device according to an exemplary embodiment of the present invention.
Figure 2:
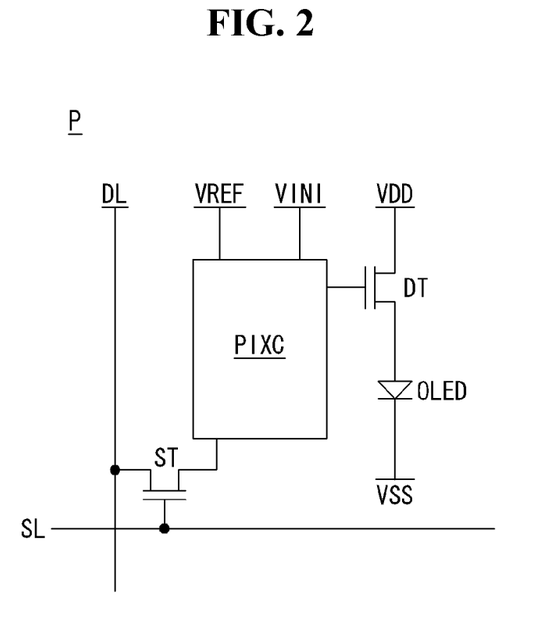
FIG. 2 is an equivalent circuit diagram of a pixel of a pixel array shown in FIG. 1.

FIG. 1 illustrates a display device according to an exemplary embodiment of the present invention. FIG. 2 is an equivalent circuit diagram of a pixel of a pixel array shown in FIG. 1. Referring to FIGS. 1 and 2, the display device according to an exemplary embodiment of the present invention includes a display panel DIS, a scan drive circuit, a data drive circuit, a timing control circuit TCON and a power source PS. The display device may be implemented as a flat panel display such as a liquid crystal display (LCD), field emission display (FED), plasma display panel (PDP), organic light emitting diode (OLED) display, etc. While the display device is implemented as an OLED display device in the following embodiment, the present invention is not limited thereto.

A pixel array PA including pixels arranged in a matrix form at intersections of data lines DL and scan lines SL is formed on a first substrate of the display panel DIS. Each pixel P controls current flowing through an OLED using a switching TFT (thin film transistor) and a driving TFT to display an image. Specifically, each pixel P of the display panel DIS includes a switching TFT (ST), a driving TFT (DT), an OLED and a compensation circuit PIXC, as shown in FIG. 2. The switching TFT (ST) provides data voltages of data lines DL to the compensation circuit PIXC in response to scan pulses of scan lines SL. The compensation circuit PIXC includes one or more switch TFTs and one or more capacitors, initializes a gate electrode of the driving TFT (DT) and then senses the threshold voltage of the driving TFT (DT), and adds the threshold voltage to the data voltages to compensate for the data voltages. The driving TFT (DT) controls current flowing through the OLED according to a data voltage applied to the gate electrode thereof. To achieve this, the driving TFT (DT) can be connected to a first power line VDDL through which a first source voltage VDD is supplied. The compensation circuit PIXC can be connected to a second power line VREFL through which a second source voltage VREF is supplied and a third power line VINIL through which a third source voltage VINI is provided. The OLED can be connected to a fourth power line VSSL through which a fourth source voltage VSS is supplied. Any pixel compensation circuit of known OLED display devices can be applied as the compensation circuit PIXC. The display panel DIS can display images according to bottom emission and top emission.

The data drive circuit includes a plurality of source drive ICs (S-ICs). The source drive ICs (S-ICs) receive digital video data from the timing control circuit TCON. The source drive ICs (S-ICs) convert the digital video data into analog data voltages in response to a timing control signal from the timing control circuit TCON, and supply the analog data voltages synchronized with scan pulses to the data lines DL of the display panel DIS.

Each source drive IC (S-IC) is mounted on COF (chip on film) and COFs are bonded to the first substrate and source printed circuit boards SPCB1 and SPCB2. When the display panel DIS is a large-screen display panel, the COFs are divided and bonded to the first source printed circuit board SPCB1 and the second source printed circuit board SPCB2, as shown in FIG. 1. Otherwise, the source drive ICs (S-ICs) may be bonded to the first substrate of the display panel DIS according to a COG (chip on glass) process.

Scan drive circuits GIC1 and GIC2 sequentially provide scan pulses for controlling switching TFTs of the pixels to the scan lines in response to a scan timing control signal input through a LOG (line on glass). The scan drive circuits GIC1 and GIC2 can be formed on both sides of the pixel array PA, as shown in FIG. 1. In this case, the scan drive circuits GIC1 and GIC2 can simultaneously supply the scan pulses to the same scan line. Alternatively, the scan drive circuits can be formed on only one side of the pixel array PA.

The scan drive circuits GIC1 and GIC2 include gate drive ICs and may be bonded to the first substrate of the display panel DIS through a COG process. Otherwise, the scan drive circuits GIC1 and GIC2 may be directly formed on the first substrate simultaneously with the pixel array through a GIP (Gate In Panel) process. Furthermore, the scan drive circuits GIC1 and GIC2 may be mounted on a TCP (Tape Carrier Package) or bonded to a lower substrate of the display panel DIS through a TAB (Tape Automated Bonding) process.

The timing control circuit TCON and power source PS are mounted on a control printed circuit board CPCB. The control printed circuit board CPBC is connected to the source printed circuit boards SPBC1 and SPCB2 through a flexible cable such as a flexible printed circuit (FPC).

The timing control circuit TCON receives digital video data from an external host system (not shown). The timing control circuit TCON receives timing signals such as a vertical synchronization signal, a horizontal synchronization signal, a data enable signal, a dot clock signal, etc. The timing control circuit TCON generates timing control signals for controlling operation timing of the scan drive circuits GIC1 and GIC2 and operating timing of the data drive circuit on the basis of the digital video data and timing signals. The timing control signals include a scan timing control signal for controlling the operating timing of the scan drive circuits GIC1 and GIC2 and a data timing control signal for controlling operating timing of the data drive circuit. The timing control circuit TCON outputs the scan timing control signal to the scan drive circuits GIC1 and GIC2 and outputs the data timing control signal to the data drive circuit.

The power source PS provides first to p-th (p being a natural number greater than 1) source voltages to first to p-th power lines of the display panel DIS. The first to p-th power lines of the display panel DIS will be described in detail below with reference to FIG. 3.

Figure 3:
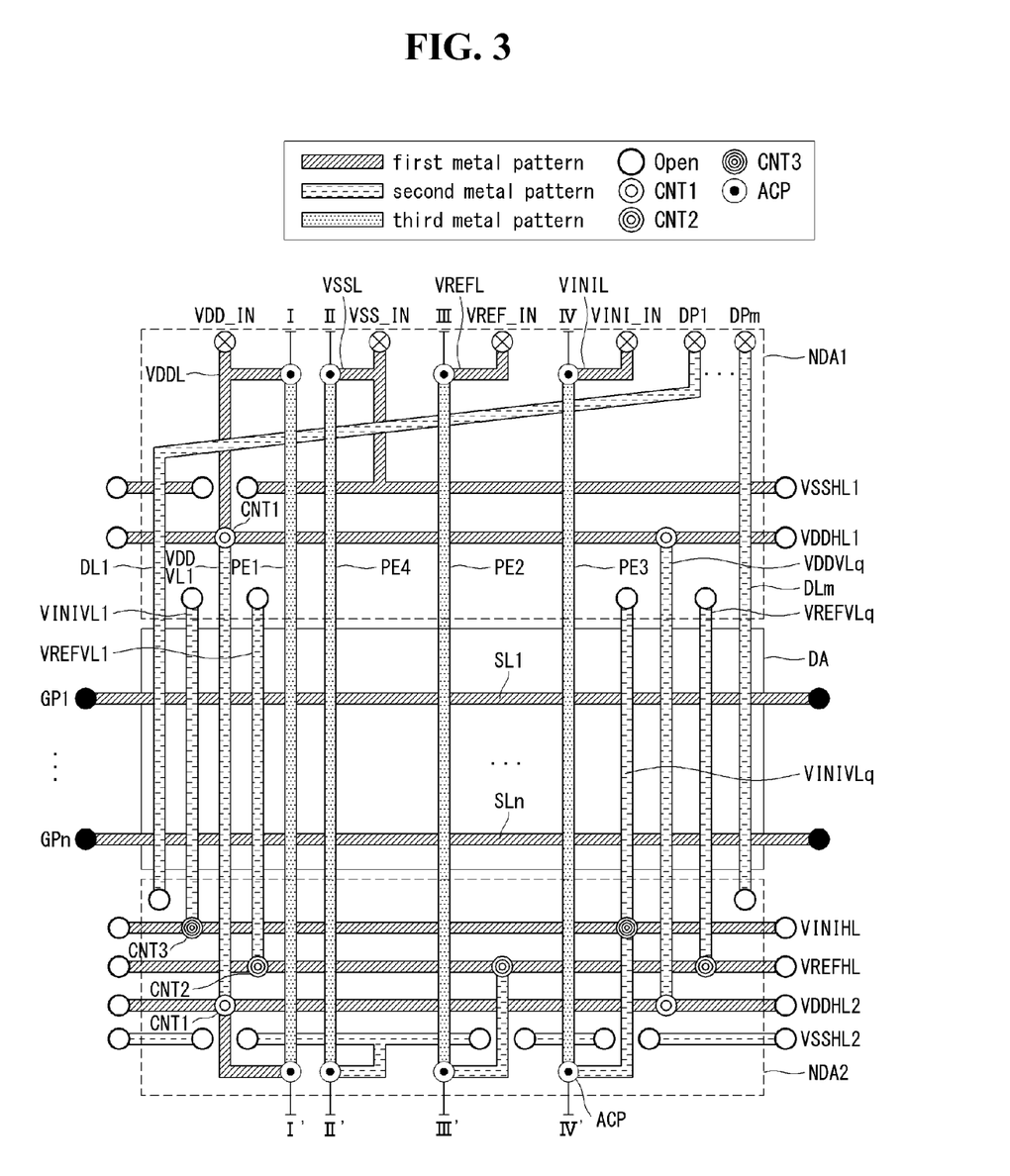
FIG. 3 illustrates power lines and auxiliary electrodes formed on first and second substrates of a display panel.

FIG. 3 illustrates power lines and auxiliary electrodes formed on the first and second substrates of the display panel. FIG. 3 shows first to fourth power lines VDDL, VREFL, VINIL and VSSL, first to fourth auxiliary electrodes PE1 to PE4, a first data line DL1 and an m-th (m being a natural number greater than 2 and representing the number of pixels corresponding to a horizontal line) data line DLm. In FIG. 3, only the first data line DL1 and m-th data line DLm are illustrated for convenience of description and second to (m−1)-th data lines DL2 to DLm−1 are omitted. The first data line DL1 may be connected to a first data pad DP1 and the m-th data line DLm may be connected to an m-th data pad DPm. While FIG. 3 shows the first to fourth power lines VDDL, VREFL, VINIL and VSSL and the first to fourth auxiliary electrodes PE1 to PE4, the number of power lines and the number of auxiliary electrodes are not limited thereto.

Referring to FIG. 3, the first to p-th power lines through which first to p-th source voltages are supplied are formed on the first substrate and the first to p-th auxiliary electrodes are formed on the second substrate. The first to p-th power lines are respectively connected to first to p-th source voltage input terminals to be provided with the first to p-th source voltages. The power source PS supplies the first to p-th source voltage to the first to p-th source voltage input terminals. For example, as shown in FIG. 3, the first power line VDDL is connected to the first source voltage input terminal VDD_IN to be provided with the first source voltage VDD and the second power line VREFL is connected to the second source voltage input terminal VREF_IN to be provided with the second source supply voltage VREF. The third power line VINIL is connected to the third source voltage input terminal VINI_IN to be provided with the third source voltage VINI, and the fourth power line VSSL is connected to the fourth source voltage input terminal VSS_IN to be provided with the fourth source voltage VSS.

The first to p-th power lines are respectively connected to the first to p-th auxiliary electrodes. That is, the first power line VDDL is connected to the first auxiliary electrode PE1, the second power line VREFL is connected to the second auxiliary electrode PE2, the third power line VINIL is connected to the third auxiliary electrode PE3, and the fourth power line VSSL is connected to the fourth auxiliary electrode PE4. Particularly, the first to p-th power lines are connected to the first to p-th auxiliary electrodes in a non-display area NDA other than a display area DA corresponding to the pixel array. The non-display area NDA includes a first non-display area NDA1 formed at the outside of one side of the display area DA and a second non-display area NDA2 formed at the outside of another side (e.g. opposite side) of the display area DA. For example, the first non-display area NDA1 may be formed at the outside of the upper side of the display area DA and the second non-display area NDA2 may be formed at the outside of the bottom side of the display area DA as shown in FIG. 3. The first to p-th source voltage input terminals are formed in the first non-display area NDA1. The first to p-th power lines may be connected to the first to p-th auxiliary electrodes using anisotropic conductive paste (ACP). The first to p-th auxiliary electrodes may be formed of a third metal pattern. The third metal pattern may be implemented as a transparent metal pattern.

The first to p-th power lines may be connected to the first to p-th auxiliary electrodes in the display area DA. In this case, the first to p-th power lines may be connected to the first to p-th auxiliary electrodes using ACP in a non-emissive region of the display area DA. Here, contact holes for exposing the first to p-th power lines in the non-emissive region of the display area DA may be formed. The non-emissive region of the display area DA may be a region in which pixels are not formed or a region between pixels.

At least one of the first to p-th power lines includes vertical lines formed in parallel with the data lines DL and a horizontal line formed in parallel with the scan lines SL in the non-display areas NDA1 and NDA2. While the first power line corresponds to a high voltage line VDDL through which a high voltage VDD is supplied, the second power line corresponds to a reference voltage line VREFL through which a reference voltage VREF is supplied, the third power line corresponds to an initialization voltage line VINIL through which an initialization voltage VINI is supplied and the fourth power line corresponds to a low voltage line VSSL through which a low voltage VSS is supplied in the following description, it is noted that the present invention is not limited thereto. The high voltage VDD is set higher than the low voltage VSS. The reference voltage VREF and the initialization voltage VINI may depend on pixel design.

Specifically, the high voltage line VDDL includes a first high voltage horizontal line VDDHL1 formed in parallel with the scan lines SL in the first non-display area NDA1 and a second high voltage horizontal line VDDHL2 formed in parallel with the scan lines SL in the second non-display area NDA2. In addition, the high voltage line VDDL includes q (q being a natural number greater than 1) high voltage vertical lines VDDVL connected to the first high voltage horizontal line VDDHL1 in the first non-display area NDA1 and/or to the second high voltage horizontal line VDDHL2 in the second non-display area NDA2, and formed in parallel with the data lines DL, preferably to traverse the display area DL. In one or more embodiments, the number q of high voltage vertical lines VDDVL may be the same as the number m of data lines DL. In one or more embodiments, the number q of high voltage vertical lines VDDVL may be half the number of data lines DL. It is noted that only the first and q-th high voltage vertical lines VDDVL1 and VDDVLq are shown in FIG. 3 for convenience of description and the second to (q−1)-th high voltage vertical lines are omitted. Furthermore, each high voltage vertical line VDDVL may be connected to the first and second high voltage horizontal lines VDDHL1 and VDDDHL2 through a first contact hole CNT1 in the first and second non-display areas NDA1 and NDA2. Here, the first and second high voltage horizontal lines VDDHL1 and VDDHL2 may be formed of a first metal pattern. The high voltage vertical lines VDDVL between the first and second high voltage horizontal lines VDDHL1 and VDDHL2 may be formed of a second metal pattern. The high voltage vertical lines VDDVL between the first source voltage input terminal VDD_IN and the first high voltage horizontal line VDDHL1 may be formed of the first metal pattern. The first metal pattern may be implemented as a gate metal pattern and the second metal pattern may be implemented as a data metal pattern.

The reference voltage line VREFL includes a reference voltage horizontal line VREFHL formed in parallel with the scan lines SL in the second non-display area NDA2. In addition, the reference voltage line VREFL includes q reference voltage vertical lines VREFVL connected to the reference voltage horizontal line VREFHL in the second non-display area NDA2 and formed in parallel with the data lines DL, preferably to traverse the display area DA. It is noted that only the first and q-th reference voltage vertical lines VREFVL1 and VREFVLq are shown in FIG. 3 for convenience of description and the second to (q−1)-th reference voltage vertical lines are omitted. Furthermore, each reference voltage vertical line VREFVL may be connected to the reference voltage horizontal line VREFHL through a second contact hole CNT2 in the second non-display areas NDA2. The reference voltage horizontal line VREFHL may be formed of the first metal pattern and the reference voltage vertical lines VREFVL may be formed of the second metal pattern. The first metal pattern may be implemented as the gate metal pattern and the second metal pattern may be implemented as the data metal pattern. In one or more embodiments, the number of reference voltage vertical lines VREFVL may be the same as the number of high voltage vertical lines VDDVL, as shown. However, in one or more embodiments, the number of reference voltage vertical lines VREFVL may be different from the number of high voltage vertical lines VDDVL.

The initialization voltage line VINIL includes an initialization voltage horizontal line VINIHL formed in parallel with the scan lines SL in the second non-display area NDA2. In addition, the initialization voltage line VINIL includes q initialization voltage vertical lines VINIVL connected to the initialization voltage horizontal line VINIHL in the second non-display area NDA2 and formed in parallel with the data lines DL, preferably to traverse the display area DA. It is noted that only the first and q-th initialization voltage vertical lines VINIVL1 and VINIVLq are shown in FIG. 3 for convenience of description and the second to (q−1)-th initialization voltage vertical lines are omitted. Furthermore, each initialization voltage vertical line VINIVL may be connected to the initialization voltage horizontal line VINIHL through a third contact hole CNT3 in the second non-display areas NDA2. The initialization voltage horizontal line VINIHL may be formed of the first metal pattern and the initialization voltage vertical lines VINIVL may be formed of the second metal pattern. The first metal pattern may be implemented as the gate metal pattern and the second metal pattern may be implemented as the data metal pattern. In one or more embodiments, the number of initialization voltage vertical lines VINIVL may be the same as the number of high voltage vertical lines VDDVL and the number of reference voltage vertical lines VREFVL, as shown. However, in one or more embodiments, the number of initialization voltage vertical lines VINIVL may be different from the number of high voltage vertical lines VDDVL and/or the number of reference voltage vertical lines VREFVL.

The low voltage line VSSL includes a first low voltage horizontal line VSSHL1 formed in parallel with the scan lines SL in the first non-display area NDA1 and a second low voltage horizontal line VSSHL2 formed in parallel with the scan lines SL in the second non-display area NDA2. The first low voltage horizontal line VSSHL1 may be opened near the high voltage line VDDL, as shown in FIG. 3, in order to prevent short circuit with the high voltage line VDDL. The second low voltage horizontal line VSSHL2 may be opened near the high voltage line VDDL, reference voltage line VREFL and initialization voltage line VINIL, as shown in FIG. 3, in order to prevent short circuit with the high voltage line VDDL, reference voltage line VREFL and initialization voltage line VINIL. The first and second low voltage horizontal lines VSSHL1 and VSSHL2 may be connected to a second electrode (240 of FIG. 4) formed on the overall surface of the display panel DIS in the open regions to function as the ground GND. The first low voltage horizontal line VSSHL1 may be formed of the first metal pattern and the second low voltage horizontal line VSSHL2 may be formed of the second metal pattern. The first metal pattern may be implemented as the gate metal pattern and the second metal pattern may be implemented as the data metal pattern.

As described above, the present invention can provide the high source voltage VDD, reference voltage VREF and initialization voltage VINI to pixels through the high voltage vertical lines VDDVL, reference voltage vertical lines VREFVL and initialization voltage vertical lines VINIVL formed in the display area DA, as shown in FIG. 3. Furthermore, the present invention can provide the uniform high voltage VDD to the pixels through the first and second high voltage horizontal lines VDDHL1 and VDDHL2 formed in the first and second non-display areas NDA1 and NDA2. In addition, the present invention can supply the uniform reference voltage VREF to the pixels through the reference voltage horizontal line VREFHL formed in the second non-display area NDA2 and supply the uniform initialization voltage VINI to the pixels through the initialization voltage horizontal line VINIL. The present invention forms the first to p-th power lines through which the first to p-th source voltage are supplied on the first substrate, forms the first to p-th auxiliary electrodes on the second substrate and respectively connects the first to p-th power lines to the first to p-th auxiliary electrodes. Consequently, the present invention can minimize overlap between power lines in the first non-display area, thereby minimizing the possibility of short-circuit of power lines.

Figure 4A:
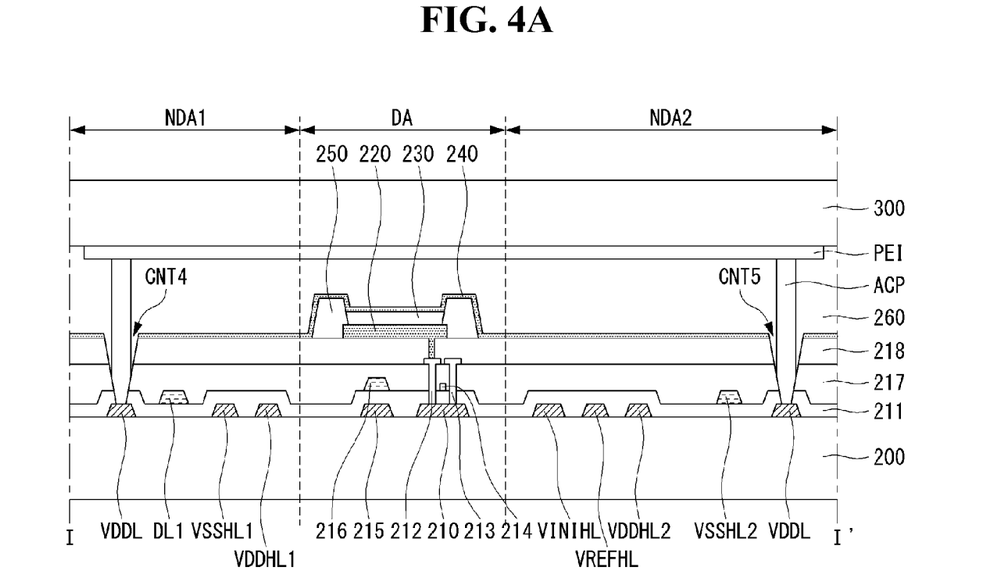
FIGS. 4A and 4B are cross-sectional views taken along line I-I' of FIG. 3 and FIGS. 5A and 5B are cross-sectional views taken along line II-II' of FIG. 3.
Figure 4B:
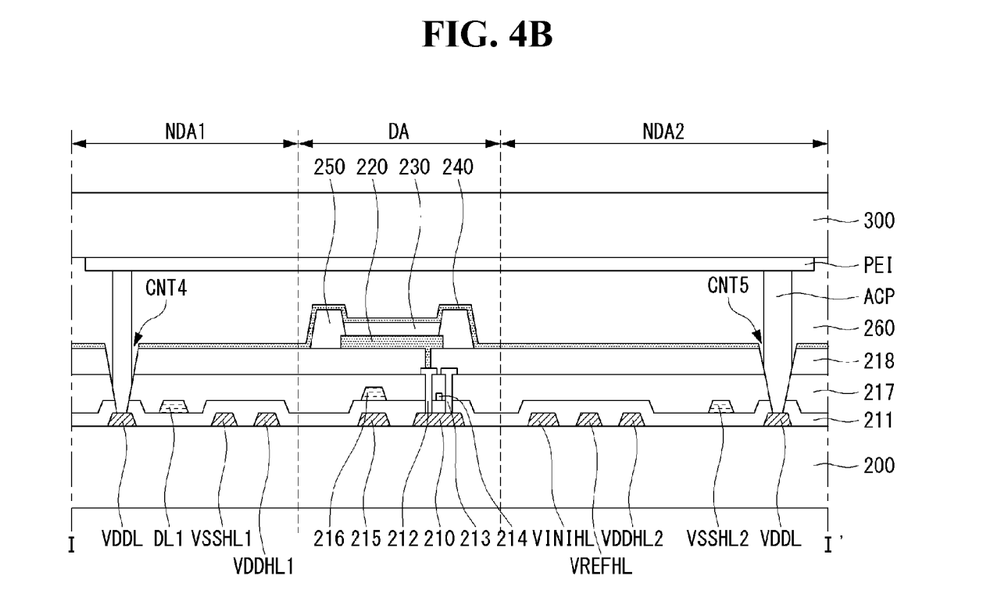

FIGS. 4A and 4B are cross-sectional views taken along line I-I' of FIG. 3. FIGS. 4A and 4B show connection of the high voltage line VDDL and the first auxiliary electrode PE1. FIG. 4A shows a contact area of the anisotropic conductive paste ACP is the same as in the second non-display area NDA2 and in the first non-display area NDA1. FIG. 4B shows a contact area of the anisotropic conductive paste ACP is greater in the second non-display area NDA2 than in the first non-display area NDA1. The first to p-th source voltage input terminals VDD_IN, VREF_IN, VINI_IN, VSS_IN that supply voltages to the first to p-th power lines are formed in the first non-display area NDA1 and first to p-th source voltage input terminals are not formed in the second non-display area NDA2. Accordingly, the contact area of the anisotropic conductive paste ACP may be greater in the second non-display area NDA2 than in the first non-display area NDA1. As a result, a contact resistance of the anisotropic conductive paste ACP decreases and power consumption decreases. The contact area of the anisotropic conductive paste may be differently formed according to the width of at least one of the first to p-th auxiliary electrodes. Referring to FIGS. 4A and 4B, the display device according to an embodiment of the present invention includes a first substrate 200 and a second substrate 300. The first auxiliary electrode PE1 is formed on the second substrate 300. The first auxiliary electrode PE1 may be formed of a transparent metal pattern, for example made of ITO (Indium Tin Oxide), IZO (Indium Zinc Oxide), ICO (Indium Cerium Oxide) or ZnO (zinc oxide).

The high voltage line VDDL is formed of the gate metal pattern in the first non-display area NDA1 of the first substrate 200. The high voltage line VDDL is exposed through a fourth contact hole CNT4 that penetrates a gate insulating layer 211, an interlevel insulating layer 217, an overcoat layer 218 and the second electrode 240 and connected to the first auxiliary electrode PE1 of the second substrate 300 through ACP in the first non-display area NDA1. That is, ACP bonds the high voltage line VDDL of the first substrate 200 and the first auxiliary electrode PE1 of the second substrate 300 to each other. The first data line DL1 is formed of the data metal pattern and the first low voltage horizontal line VSSHL1 and the first high voltage horizontal line VDDHL1 are formed of the gate metal pattern in the first non-display area NDA1 of the first substrate 200. The gate insulating layer 211 covers the first low voltage horizontal line VSSHL1 and the first high voltage horizontal line VDDHL1 and the interlevel insulating layer 217 covers the first data line DL1.

The high voltage line VDDL is formed of the gate metal pattern in the second non-display area NDA2 of the first substrate 200. The high voltage line VDDL is exposed through a fifth contact hole CNT5 that penetrates the gate insulating layer 211, interlevel insulating layer 217 and overcoat layer 218 and connected to the first auxiliary electrode PE1 of the second substrate 300 through ACP in the second non-display area NDA2. That is, ACP bonds the high voltage line VDDL of the first substrate 200 and the first auxiliary electrode PE1 of the second substrate 300 to each other. Accordingly, the high voltage line VDDL of the first non-display area NDA1 and the high voltage line VDDL of the second non-display area NDA2 are connected to each other through the first auxiliary electrode PE1 formed on the second substrate 300 and thus the high voltage line VDDL of the first non-display area NDA1 and the high voltage line VDDL of the second non-display area NDA2 have the same potential.

The initialization voltage horizontal line VINIHL, the reference voltage horizontal line VREFHL and the second high voltage horizontal line VDDHL2 are formed of the gate metal pattern and the second low voltage horizontal line VSSHL2 is formed of the data metal pattern in the second non-display area NDA2 of the first substrate 200. The gate insulating layer 211 covers the initialization voltage horizontal line VINIHL, the reference voltage horizontal line VREFHL and the second high voltage horizontal line VDDHL2 and the interlevel insulating layer 217 covers the second low voltage horizontal line VSSHL2.

While the display area DA includes a plurality of pixels in FIG. 3, it is noted that FIGS. 4A and 4B show only a certain pixel formed in the display area DA. A driving TFT DT, a capacitor CAP and an organic light emitting diode OLED, which are included in the pixel, are formed in the display area DA of the first substrate 200. The driving transistor DT and the capacitor CAP are formed in the display area DA on the first substrate 200. The driving transistor DT includes a gate electrode 214, a semiconductor layer 210 and source/drain electrodes 212 and 213. The gate insulating layer 211 is formed between the gate electrode 214 and the semiconductor layer 210 and the interlevel insulating layer 217 is formed between the gate electrode 214 and the overcoat layer 218. The capacitor CAP includes a capacitor lower electrode 215 and a capacitor upper electrode 216 having the gate insulating layer 211 interposed therebetween. The overcoat layer 218 covers the source/drain electrodes 212 and 213 of the driving transistor DT. The overcoat layer 218 protects the driving transistor DT and the capacitor CAP and planarizes the driving transistor DT.

The OLED includes a first electrode 220, an organic emission layer 230 and the second electrode 240. The first electrode 220 is connected to the source electrode 212 of the driving transistor DT, exposed from the overcoat layer 218. The first electrode 220 corresponds to an anode and may be formed of a transparent metal pattern, for example made of ITO, IZO, ICO or ZnO. The first electrode 220 is electrically connected to the source electrode 212 of the driving transistor DT through a via-hole that penetrates the overcoat layer 218 to expose the source electrode 212 of the driving transistor DT.

A bank layer 250 is formed on the first electrode 220. The bank layer 250 exposes part of the first electrode 220 to define a pixel region. The organic emission layer 230 is formed on the first electrode 220. The organic emission layer 230 is a layer in which electrons and holes are combined to emit light. A hole injection layer or a hole transport layer may be interposed between the organic emission layer 230 and the first electrode 220 and an electrode transport layer or an electrode injection layer may be interposed between the organic emission layer 230 and the second electrode 240.

The second electrode 240 is formed on the organic emission layer 230. The second electrode 240 corresponds to a cathode and may be formed of a metal such as, for example, Mg, Ca, Al, Ag or an alloy thereof. The second electrode 240 may be formed on the overall surface of the first substrate 200.

While the bottom emission type display device constructed such that light generated from the organic emission layer 230 is emitted toward the first substrate 200 has been described, the present invention is not limited thereto and a top emission type display device emitting light from the organic emission layer 230 toward the second substrate 300 can be implemented. In the case of a top emission type display device, for example, the first electrode 220 can include a reflective layer formed therebeneath, which is made of a metal such as, for example, Al, Ag or Ni, and the second electrode 240 can be formed to a thickness, for example, 1 to 50 Å such that the second electrode 240 can transmit light.

A passivation layer (not shown) may be formed on the second electrode 240 to cover the second electrode 240 along the step coverage of the second electrode 240. The passivation layer (not shown) protects elements formed therebeneath and prevents moisture from infiltrating the organic emission layer 230 and may be formed as a single-layer or multiple layers of inorganic materials such as silicon oxide, silicon nitride, etc. The first substrate 200 and the second substrate 300 are bonded to each other using a sealant 260.

Figure 5A:
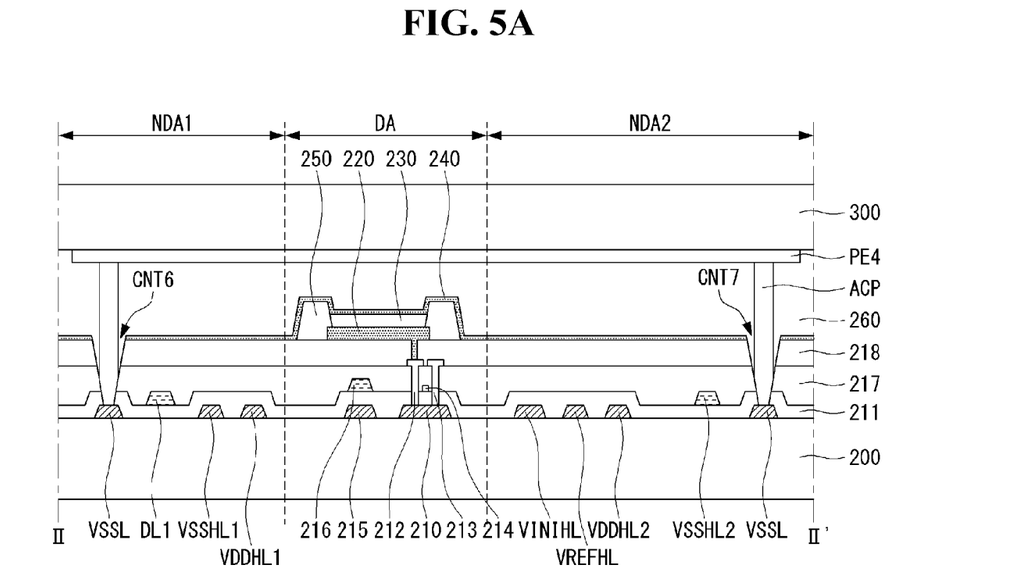
Figure 5B:
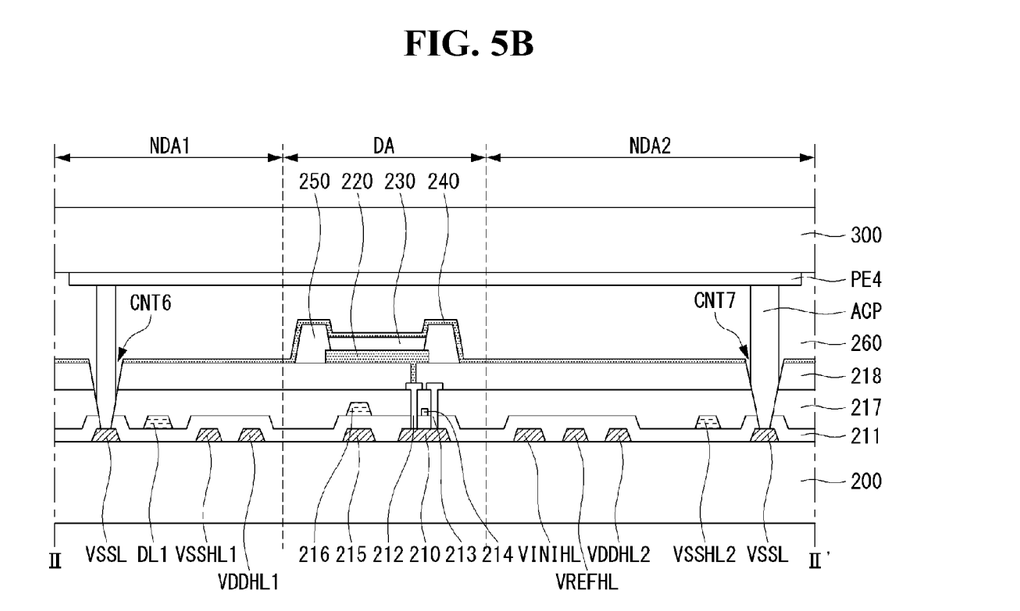

FIGS. 5A and 5B are cross-sectional views taken along line II-II' of FIG. 3. FIGS. 5A and 5B show connection of the low voltage line VSSL and the fourth auxiliary electrode PE4. The first non-display area NDA1 and the second non-display area NDA2 shown in FIGS. 5A and 5B correspond to the first non-display area NDA1 and the second non-display area NDA2 shown in FIGS. 4A and 4B. Accordingly, detailed description of the first non-display area NDA1 and the second non-display area NDA2 shown in FIGS. 5A and 5B is omitted.

Referring to FIGS. 5A and 5B, the low voltage line VSSL is formed of the gate metal pattern in the second non-display area NDA2 of the first substrate 200. The low voltage line VSSL is exposed through a seventh contact hole CNT7 that penetrates the interlevel insulating layer 217 and overcoat layer 218 and connected to the fourth auxiliary electrode PE4 of the second substrate 300 through ACP in the second non-display area NDA2. That is, ACP bonds the low voltage line VSSL of the first substrate 200 and the fourth auxiliary electrode PE4 of the second substrate 300 to each other. Accordingly, the low voltage line VSSL of the first non-display area NDA1 and the low voltage line VSSL of the second non-display area NDA2 are connected to each other through the fourth auxiliary electrode PE4 formed on the second substrate 300 and thus the low voltage line VSSL of the first non-display area NDA1 and the low voltage line VSSL of the second non-display area NDA2 have the same potential.

The initialization voltage horizontal line VINIHL, the reference voltage horizontal line VREFHL and the second high voltage horizontal line VDDHL2 are formed of the gate metal pattern and the second low voltage horizontal line VSSHL2 is formed of the data metal pattern in the second non-display area NDA2 of the first substrate 200. The gate insulating layer 211 covers the initialization voltage horizontal line VINIHL, the reference voltage horizontal line VREFHL and the second high voltage horizontal line VDDHL2, and the interlevel insulating layer 217 covers the second low voltage horizontal line VSSHL2.

Figure 6A:
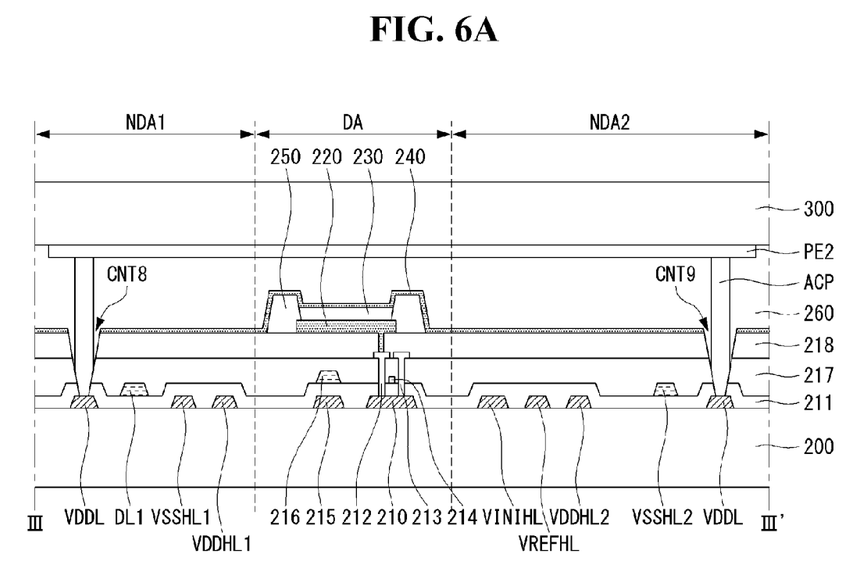
FIGS. 6A and 6B are cross-sectional views taken along line III-III' of FIG. 3 and FIGS. 7A and 7B are cross-sectional views taken along line IV-IV' of FIG. 3.
Figure 6B:
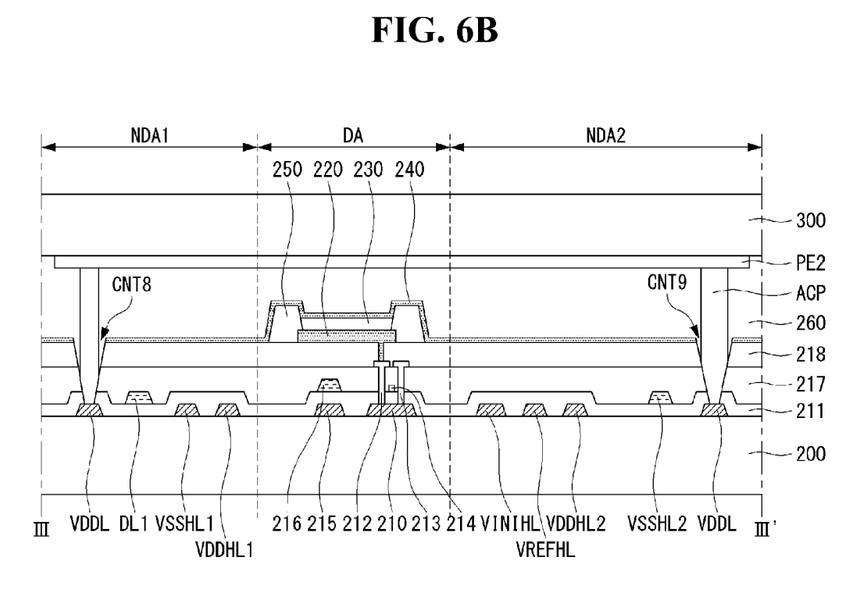
Figure 7A:
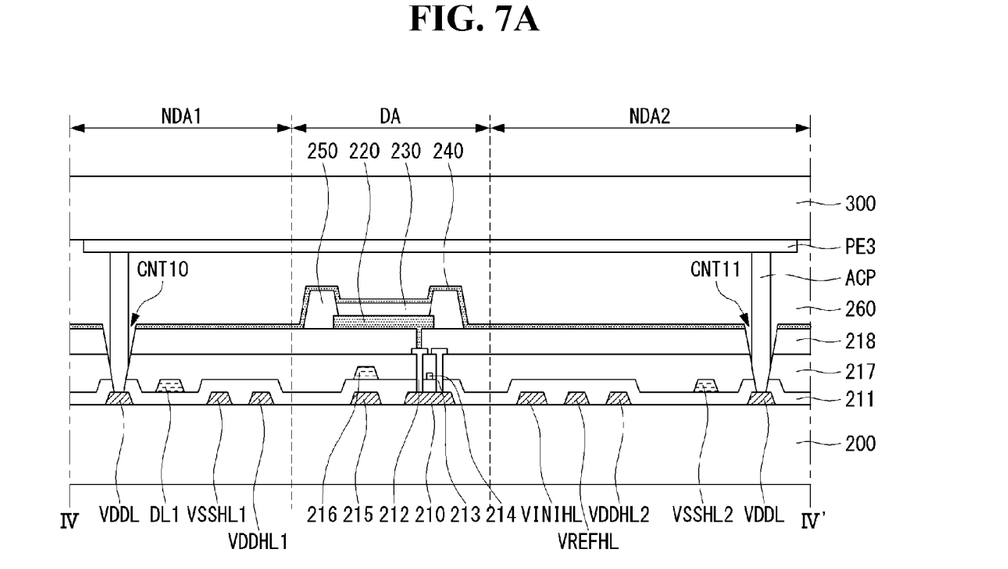
Figure 7B:
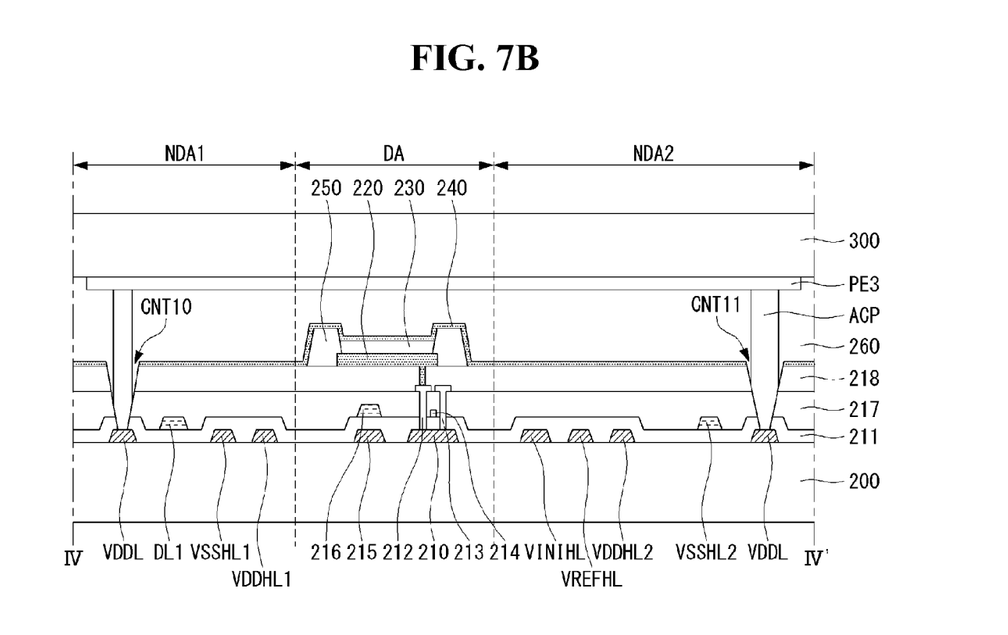

FIGS. 6A and 6B are cross-sectional views taken along line III-III' of FIG. 3. FIGS. 6A and 6B show connection of the reference voltage line VREFL and the second auxiliary electrode PE2. FIGS. 7A and 7B are cross-sectional views taken along line IV-IV' of FIG. 3. FIGS. 7A and 7B show connection of the initialization voltage line VINIL and the third auxiliary electrode PE3. The cross section III-III' showing connection of the reference voltage line VREFL and the second auxiliary electrode PE2 and the cross section IV-IV' showing connection of the initialization voltage line VINIL and the third auxiliary electrode PE3 are identical to FIGS. 5A and 5B.

Figure 8:
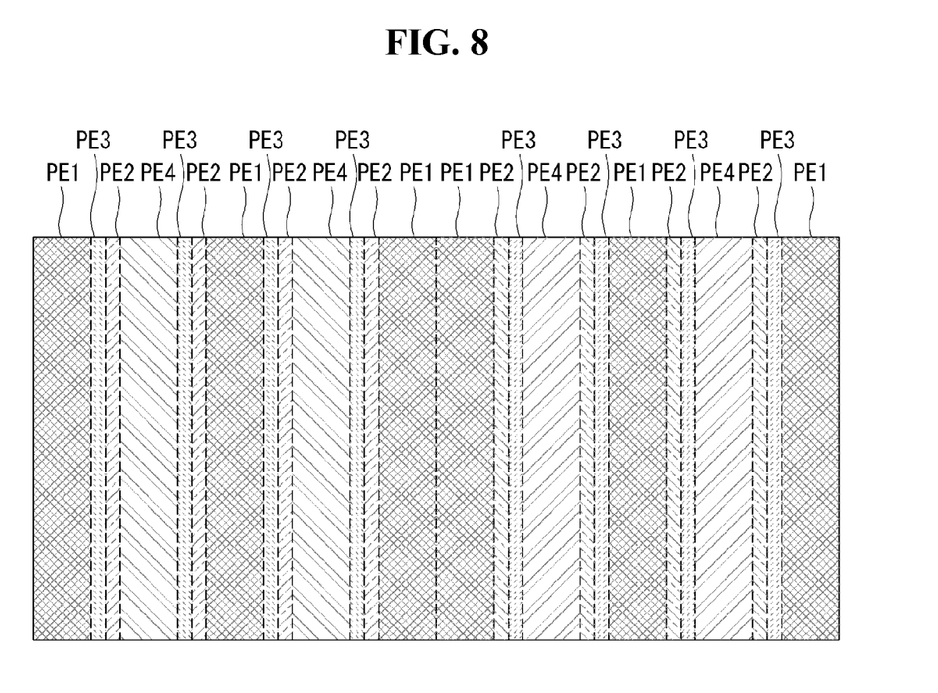
FIG. 8 illustrates auxiliary electrodes formed on an upper substrate of FIG. 3.

FIG. 8 illustrates auxiliary electrodes formed on the upper substrate of FIG. 3. FIG. 8 shows the first to fourth auxiliary electrodes PE1 to PE4. As shown in FIG. 8, plural first auxiliary electrodes, plural second auxiliary electrodes, plural third auxiliary electrodes and plural fourth auxiliary electrodes may be formed.

Referring to FIG. 8, the width of at least one of the first to p-th auxiliary electrodes is greater than the width of at least one other of the first to p-th auxiliary electrodes. Specifically, the width of the first auxiliary electrode PE1 connected to the high voltage line VDDL may be greater than the width of the second auxiliary electrode PE2 connected to the reference voltage line VREFL and/or the third auxiliary electrode PE3 connected to the initialization voltage line VINIL. The width of the fourth auxiliary electrode PE4 connected to the low voltage line VSSL may be greater than the width of the second auxiliary electrode PE2 connected to the reference voltage line VREFL and/or the third auxiliary electrode PE3 connected to the initialization voltage line VINIL. In the case of an OLED display device, the high voltage VDD and low voltage VSS directly affect emission of OLED. Accordingly, the present invention can prevent the high voltage VDD and the low voltage VSS from fluctuating due to a decrease in the high voltage VDD and increase in the low voltage VSS by increasing the widths of the first auxiliary electrode PE1 connected to the high voltage line VDDL and the fourth auxiliary electrode PE4 connected to the low voltage line VSSL.

The first and fourth auxiliary electrodes PE1 and PE4 may have the same width and the second and third auxiliary electrodes may have the same width. Otherwise, the fourth auxiliary electrode PE4 may be widest, the first auxiliary electrode PE1 may be second widest, the second auxiliary electrode PE2 may be third widest, and the third auxiliary electrode PE3 may be fourth widest. That is, the width of the fourth auxiliary electrode PE4 connected to the fourth power line is greater than the width of the first auxiliary electrode PE1 connected to the first power line, the width of the first auxiliary electrode PE1 connected to the first power line is greater than the width of the second auxiliary electrode PE2 connected to the second power line, and the width of the second auxiliary electrode PE2 connected to the second power line is greater than the width of the third auxiliary electrode PE3 connected to the third power line. According to the width of at least one of the first to fourth auxiliary electrodes, the contact area of the anisotropic conductive paste may be differently formed.

Figure 9:
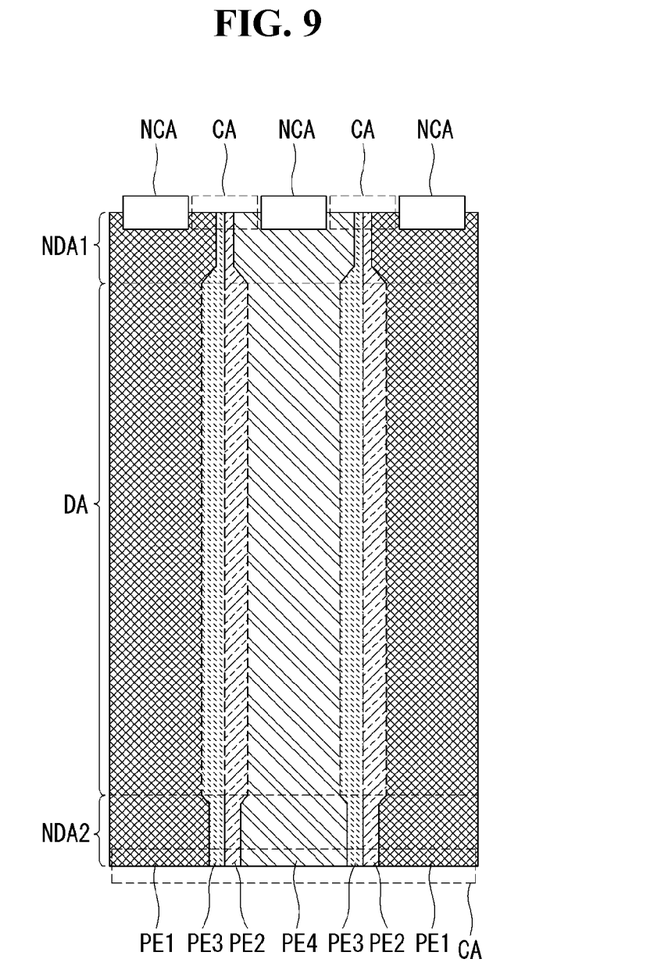
FIG. 9 illustrates widths of auxiliary electrodes of FIG. 8 in a non-display area.

FIG. 9 illustrates widths of auxiliary electrodes of FIG. 8 in a non-display area. FIG. 9 shows the first to fourth auxiliary electrodes PE1 to PE4.

Referring to FIG. 9, the non-display area includes a first non-display area NDA1 formed at the outside of one side of the display area DA and a second non-display area NDA2 formed at the outside of another side of the display area DA. The first to p-th source voltage input terminals that supply voltages to the first to p-th power lines are formed in the first non-display area NDA1 and first to p-th source voltage input terminals are not formed in the second non-display area NDA2. COF (chip on film) or drive IC is formed in the first non-display area NDA1. COF (chip on film) or drive IC is not formed in the second non-display area NDA2. Thus, non-contact area NCA and contact area CA are formed in the first non-display area NDA1. Only contact area CA is formed in the second non-display area NDA2. Accordingly, a contact area of the anisotropic conductive paste ACP is greater in the second non-display area NDA2 than in the first non-display area NDA1. The contact area of the anisotropic conductive paste ACP is differently formed according to the width of at least one of the first to p-th auxiliary electrodes.

As described above, the present invention forms the first to p-th power lines through which the first to p-th source voltages are provided on the first substrate, forms the first to p-th auxiliary electrodes on the second substrate and respectively connects the first to p-th power lines to the first to p-th auxiliary electrodes. Consequently, the present invention can minimize overlap of power lines in the first non-display area, thereby minimizing the possibility of short-circuit of power lines.

Although the embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device, comprising:
 a first substrate on which data lines, scan lines intersecting the data lines, a plurality of power lines for supplying a plurality of source voltages, and pixels arranged in a matrix form are formed,
 wherein the plurality of source voltages include a first power supply voltage (VDD) supplied from a first power line (VDDL), a reference voltage (VREF) supplied from a second power line (VREFL), an initialization voltage (VINI) supplied from a third power line (VINIL), and a second power supply voltage (VSS) supplied from a fourth power line (VSSL); and
 a second substrate on which a plurality of auxiliary electrodes including first to fourth auxiliary electrodes are formed,
 wherein the plurality of power lines including the first to fourth power lines formed on the first substrate are respectively and electrically connected to the first to fourth auxiliary electrodes directly formed on the second substrate.

2. The display device of claim 1, wherein the plurality of power lines are connected to the plurality of auxiliary electrodes in a non-display area other than a display area in which the pixels are formed.

3. The display device of claim 2, wherein the plurality of power lines are connected to the plurality of auxiliary electrodes using anisotropic conductive paste.

4. The display device of claim 2, wherein the non-display area includes a first non-display area formed at the outside of one side of the display area and a second non-display area formed at the outside of another side of the display area.

5. The display device of claim 2, wherein the first power line (VDDL) includes a first VDD horizontal line formed in parallel with the scan lines in a first non-display area and a second VDD horizontal line formed in parallel with the scan lines in a second non-display area,
 wherein a reference voltage line corresponding to the second power line (VREFL) includes a reference voltage horizontal line formed in parallel with the scan lines in the second non-display area,
 wherein an initialization voltage line corresponding to the third power line (VINIL) includes an initialization voltage horizontal line formed in parallel with the scan lines in the second non-display area.

6. The display device of claim 5, wherein the first power line (VDDL) further includes a plurality of VDD vertical lines connected to the first VDD horizontal line in the first non-display area and/or to the second VDD horizontal line in the second non-display area, and formed in parallel with the data lines, to traverse the display area.

7. The display device of claim 6, wherein the reference voltage line (VREFL) further includes a plurality of reference voltage vertical lines connected to the reference voltage horizontal line in the second non-display area and formed in parallel with the data lines, to traverse the display area; and
 wherein the initialization voltage line (VINIL) further includes a plurality of initialization voltage vertical lines connected to the initialization voltage horizontal line in the second non-display area and formed in parallel with the data lines, to traverse the display area.

8. The display device of claim 6, wherein each VDD vertical line is connected to the first VDD horizontal line through a first contact hole in the first non-display area and/or is connected to the second VDD horizontal line through a first contact hole in the second non-display area.

9. The display device of claim 8, wherein the first and second VDD horizontal lines are formed of a first metal pattern and the VDD vertical lines between the first and second VDD horizontal lines are formed of a second metal pattern.

10. The display device of claim 7, wherein each reference voltage vertical line is connected to the reference voltage horizontal line through a second contact hole in the second non-display area and each initialization voltage vertical line is connected to the initialization voltage horizontal line through a third contact hole in the second non-display area.

11. The display device of claim 10, wherein the reference voltage horizontal line is formed of the first metal pattern and the reference voltage vertical lines are formed of the second metal pattern, and the initialization voltage horizontal line is formed of the first metal pattern and the initialization voltage vertical lines are formed of the second metal pattern.

12. The display device of claim 7, wherein a second power supply voltage (VSS) line corresponding to the fourth power line (VSSL) includes a first VSS horizontal line formed in parallel with the scan lines in the first non-display area and a second VSS horizontal line formed in parallel with the scan lines in the second non-display area.

13. The display device of claim 2, wherein a width of at least one of the plurality of auxiliary electrodes is greater than a width of at least one other of the plurality of auxiliary electrodes.

14. The display device of claim 2, wherein widths of the first auxiliary electrode connected to the first power line and the fourth auxiliary electrode connected to the fourth power line are greater than widths of the second auxiliary electrode connected to the second power line and the third auxiliary electrode connected to the third power line.

15. The display device of claim 2, wherein a width of the fourth auxiliary electrode connected to the fourth power line is greater than a width of the first auxiliary electrode connected to the first power line, the width of the first auxiliary electrode connected to the first power line is greater than a width of the second auxiliary electrode connected to the second power line, and the width of the second auxiliary electrode connected to the second power line is greater than a width of the third auxiliary electrode connected to the third power line.

16. The display device of claim 3, wherein the non-display area includes a first non-display area formed at the outside of one side of the display area and a second non-display area formed at the outside of another side of the display area, and a contact area of the anisotropic conductive paste is greater in the second non-display area than in the first non-display area.

17. The display device of claim 3, wherein a plurality of source voltage input terminals that supply voltages to the plurality of power lines are formed in the first non-display area, and the plurality of source voltage input terminals are not formed in the second non-display area.

18. The display device of claim 3, wherein a contact area of the anisotropic conductive paste is formed according to a width of at least one of the plurality of auxiliary electrodes.

19. A display device, comprising:
a first substrate on which data lines, scan lines intersecting the data lines, a plurality of power lines for supplying a plurality of source voltages, and pixels arranged in a matrix form are formed; and
a second substrate on which a plurality of auxiliary electrodes plurality are formed,
wherein the plurality of power lines are respectively connected to the plurality of auxiliary electrodes,
wherein the plurality of power lines are connected to the plurality of auxiliary electrodes in a non-display area other than a display area in which the pixels are formed,
wherein a first voltage line corresponding to a first power line includes a first voltage horizontal line formed in parallel with the scan lines in a first non-display area, and a second voltage horizontal line formed in parallel with the scan lines in a second non-display area,
wherein a reference voltage line corresponding to a second power line includes a reference voltage horizontal line formed in parallel with the scan lines in the second non-display area, and
wherein an initialization voltage line corresponding to a third power line includes an initialization voltage horizontal line formed in parallel with the scan lines in the second non-display area.

\* \* \* \* \*